United States Patent [19]

Mallik et al.

[11] Patent Number: 5,685,477
[45] Date of Patent: Nov. 11, 1997

[54] METHOD FOR ATTACHING AND HANDLING CONDUCTIVE SPHERES TO A SUBSTRATE

[75] Inventors: Debendra Mallik, Chandler; Joni Hansen, Phoenix; Ashok K. Seth, Chandler; Neil R. Sugai, Phoenix, all of Ariz.

[73] Assignee: Intel Corporation, Santa Clara, Calif.

[21] Appl. No.: 495,987

[22] Filed: Jun. 28, 1995

[51] Int. Cl.⁶ .................................................. H05K 3/34
[52] U.S. Cl. ........................ 228/254; 228/246; 228/41
[58] Field of Search ........................... 228/246, 254, 228/41, 56.3, 248.5; 427/96; 437/183

[56] References Cited

U.S. PATENT DOCUMENTS

| | | | |
|---|---|---|---|
| 4,462,534 | 7/1984 | Bitaillou et al. | 228/180.1 |
| 4,830,264 | 5/1989 | Bitaillou et al. | 228/180.21 |
| 4,871,110 | 10/1989 | Fukasawa et al. | 228/41 |
| 5,060,844 | 10/1991 | Behun et al. | 228/246 |
| 5,118,027 | 6/1992 | Braun et al. | 228/41 |
| 5,279,045 | 1/1994 | Odashima et al. | 228/41 |
| 5,410,806 | 5/1995 | Schneider | 29/840 |
| 5,431,332 | 7/1995 | Kirby et al. | 228/254 |
| 5,445,313 | 8/1995 | Boyd et al. | 228/41 |
| 5,467,913 | 11/1995 | Namekawa et al. | 228/41 |
| 5,492,266 | 2/1996 | Hoebener et al. | 228/180.22 |

*Primary Examiner*—Samuel M. Heinrich
*Attorney, Agent, or Firm*—Blakely, Sokoloff, Taylor & Zafman

[57] ABSTRACT

Methods for soldering a ball grid array (BGA) integrated circuit package to a printed circuit board. One method includes the steps of applying a solder flux to the conductive surface pads of a printed circuit board and capturing a plurality of solder balls with a separate fixture. The fixture is then placed onto the printed circuit board and the solder balls are released onto the conductive surface pads. The fixture is removed and an integrated circuit package is placed onto the solder balls. Solder flux may be applied to the bottom of the package to adhere the package to the balls. The solder balls are then reflowed to attach the package to the board. The flux provides a bonding agent which maintains the position of the solder balls and package while the solder is being reflowed. Another method includes the step of placing a fixture adjacent to the integrated circuit package so that a plurality of openings in the fixture are aligned with surface pads located on the bottom surface of the package. Solder balls are then placed into the fixture holes, adjacent to the surface pads of the package. The solder is then reflowed and the fixture is removed so that the package and solder balls can be subsequently soldered to a printed circuit board.

1 Claim, 3 Drawing Sheets

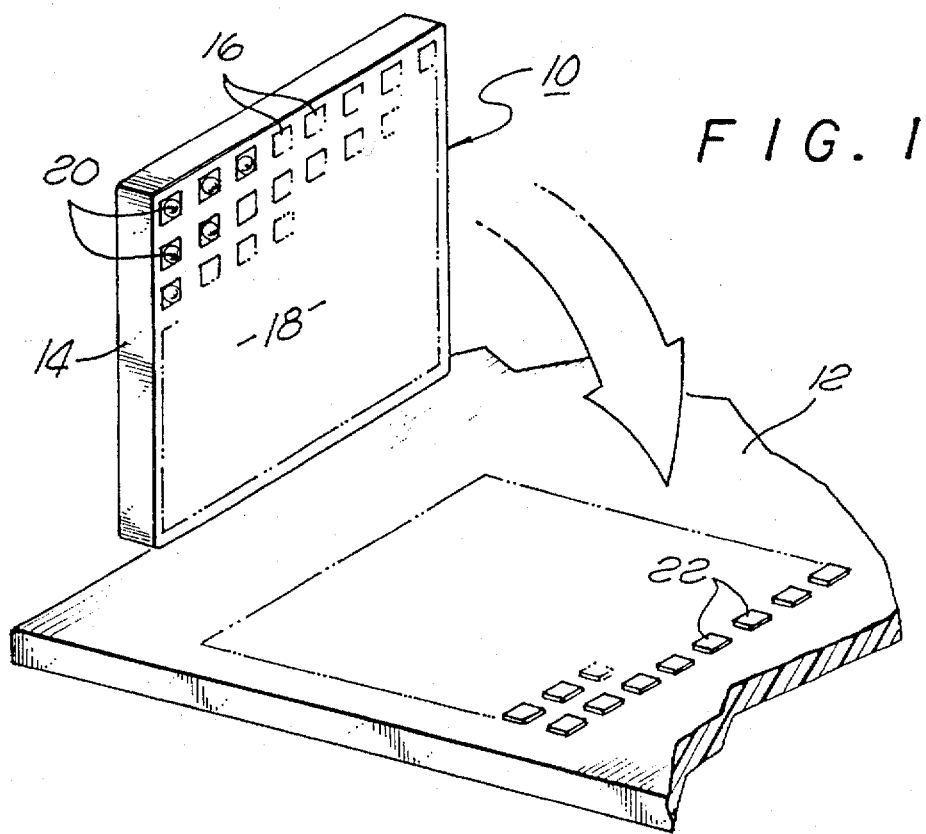
FIG. 1
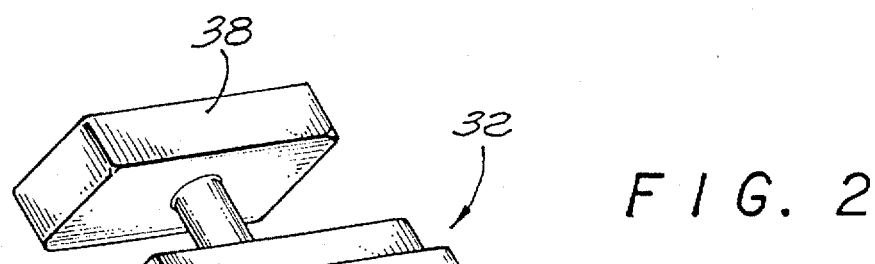
FIG. 2
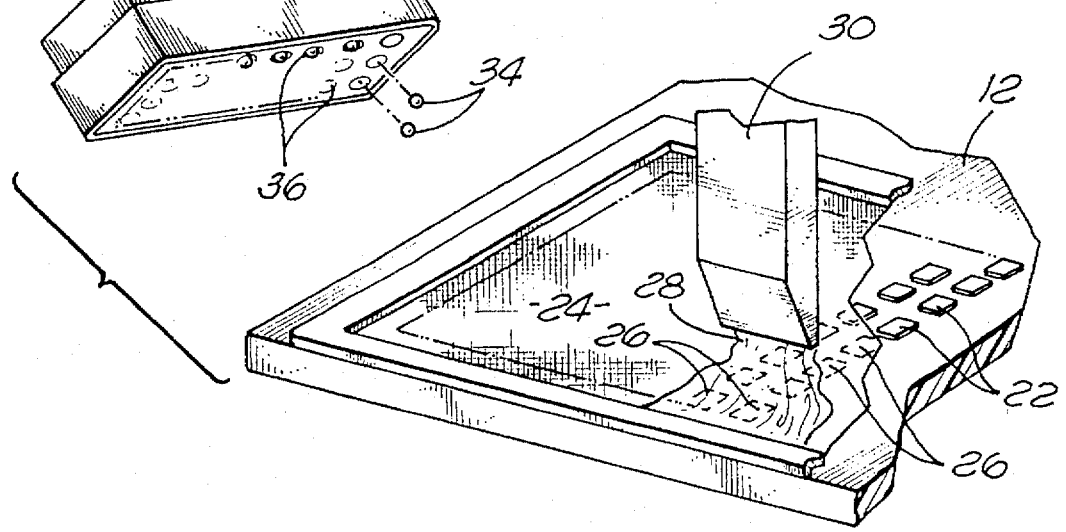

FIG. 6
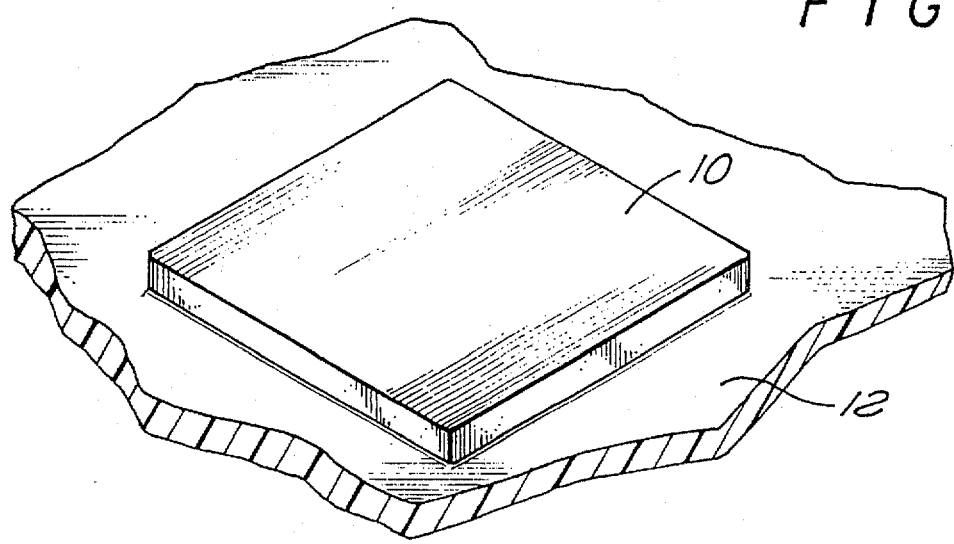
FIG. 7
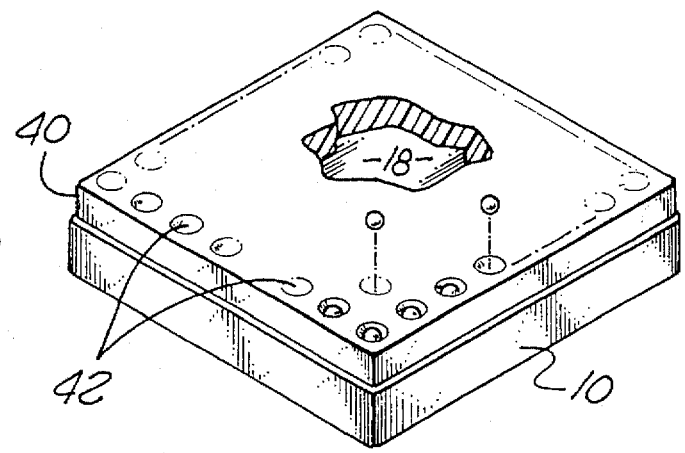
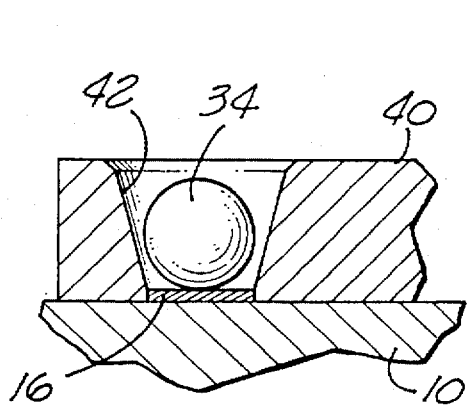
FIG. 8
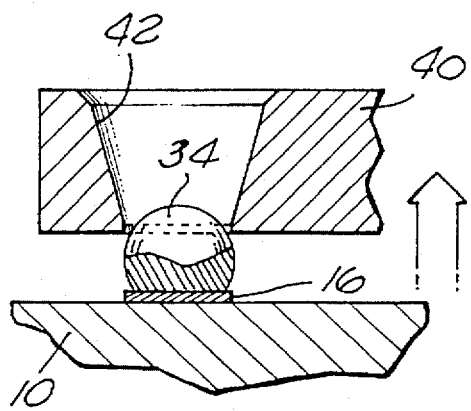
FIG. 9

METHOD FOR ATTACHING AND HANDLING CONDUCTIVE SPHERES TO A SUBSTRATE

BACKGROUND OF THE INVENTION

1. Field of the Invention

The present invention relates to a method for attaching solder balls to an electronic component such as an integrated circuit package or a printed circuit board.

2. Description of Related Art

Integrated circuits are typically housed within a package that is soldered to a printed circuit board. Conventional integrated circuit packages have a plurality of gull-wing shaped leads (gull-wing package) or straight pins (PGA package) which extend from the package housing and are soldered to corresponding solder pads or plated holes of the printed circuit board. There has also been developed an integrated circuit package which includes a plurality of solder balls that connect the package to the printed circuit board. Such an integrated circuit package is typically referred to as a BGA (ball grid array) package. The solder balls are attached to a plurality of conductive surface pads located on the bottom surface of the package. The integrated circuit package and solder balls are placed onto the printed circuit board, wherein the solder balls are reflowed to attach the package to the circuit board.

The BGA packages are typically soldered to the printed circuit board by initially applying a solder flux to the solder balls, or the conductive surface pads of the package, and then placing the solder balls onto the package. The package and solder balls are then placed onto the printed circuit board, and the solder is reflowed. The solder flux acts as a bonding agent to hold the solder balls in place while the package is being mounted onto the printed circuit board. Applying solder flux to the solder balls or conductive pads of the package is a labor intensive process which increases the overall cost of producing the printed circuit board assembly. It would therefore be desirable to have a more efficient and economical process for attaching the solder balls of a BGA package.

SUMMARY OF THE INVENTION

The present invention provides methods for soldering a ball grid array (BGA) integrated circuit package to a printed circuit board. One method includes the steps of applying a solder flux to the conductive surface pads of a printed circuit board and capturing a plurality of solder balls with a separate fixture. The fixture is then placed onto the printed circuit board and the solder balls are released onto the conductive surface pads. The fixture is removed and an integrated circuit package is placed onto the solder balls. Solder flux may be applied to the bottom of the package to adhere the package to the balls. The solder balls are then reflowed to attach the package to the board. The flux provides a bonding agent which maintains the position of the solder balls and package while the solder is being reflowed. Another method includes the step of placing a fixture adjacent to the integrated circuit package so that a plurality of openings in the fixture are aligned with surface pads located on the bottom surface of the package. Solder balls are then placed into the fixture holes, adjacent to the surface pads of the package. The solder is then reflowed and the fixture is removed so that the package and solder balls can be subsequently soldered to a printed circuit board.

BRIEF DESCRIPTION OF THE DRAWINGS

The objects and advantages of the present invention will become more readily apparent to those ordinarily skilled in the art after reviewing the following detailed description and accompanying drawings, wherein:

FIG. 1 is a perspective view of an integrated circuit package;

FIG. 2 is a perspective view showing a solder flux being screened onto a printed circuit board and a fixture capturing a plurality of solder balls;

FIG. 6 is a perspective view showing an integrated circuit package soldered to the printed circuit board;

FIG. 7 is a perspective view showing a fixture placed onto an integrated circuit package;

FIG. 8 is a cross-sectional view showing a plurality of solder balls inserted into the holes of the fixture;

FIG. 9 is perspective view showing the fixture removed and the solder balls reflowed onto the package.

DETAILED DESCRIPTION OF THE INVENTION

Figure 3:
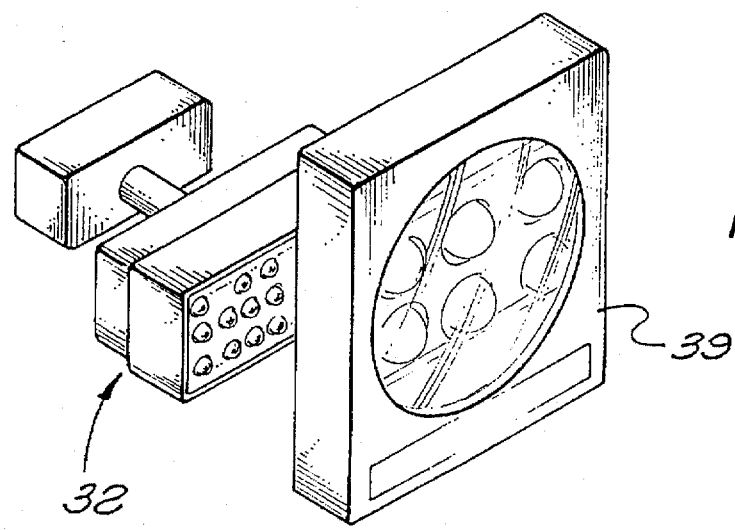
FIG. 3 is a perspective view showing the fixture being inspected to insure that the correct number of solder balls are captured by the fixture.

Referring to the drawings more particularly by reference numbers, FIG. 1 shows an integrated circuit package 10 that is typically mounted to a printed circuit board 12. The package 10 typically contains an integrated circuit (not shown) such as a microprocessor. The integrated circuit is enclosed by an outer housing 14 which has a plurality of conductive surface pads 16 located at a bottom surface 18 of the package. Attached to the conductive surface pads 16 are a plurality of solder balls 20. The printed circuit board 12 also has a plurality of conductive surface pads 22.

FIGS. 2-6 show a method for soldering the package 10 to the printed circuit board 12. A screen 24 is initially placed onto the circuit board 12. The screen 24 typically has a plurality of openings 26, or otherwise porous areas, that are aligned with the conductive surface pads 22 of the board 12. A solder flux 28 is then applied to the screen 24, typically by an applicator 30, wherein the flux 28 falls through the openings 26 and onto the surface pads 22. The screen 24 is removed from the board 12 after the flux 28 has been applied to the conductive pads 22.

A fixture 32 captures a plurality of solder balls 34. To facilitate the capture of the balls 34, the fixture 32 may have a plurality of holes 36 that are coupled to a vacuum source 38. The fixture 32 is inserted into a batch of solder balls 34 wherein the vacuum pulls the balls 34 into the holes 36. The fixture holes 36 will preferably have a depth that will prevent more than one solder ball from entering each hole 36. The step of capturing the solder balls 34 can occur simultaneously with step of applying the solder flux 28 to the printed circuit board 12.

As shown in FIG. 3, the fixture 32 may be inspected by an inspection device 39 to insure that the holes 36 are filled with solder balls 34. The inspection device 39 may be an optical recognition system that provides an indication of when a hole 36 is vacant. If a hole 36 is vacant, the fixture 32 can be reinserted into the batch of solder balls 34.

Figure 4:
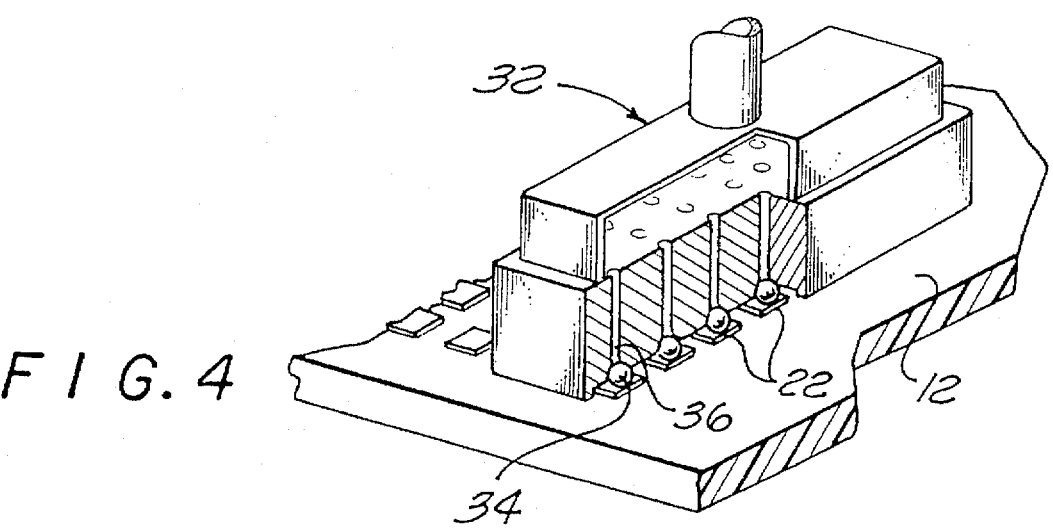
FIG. 4 is perspective view showing the fixture placed onto the printed circuit board.
Figure 5:
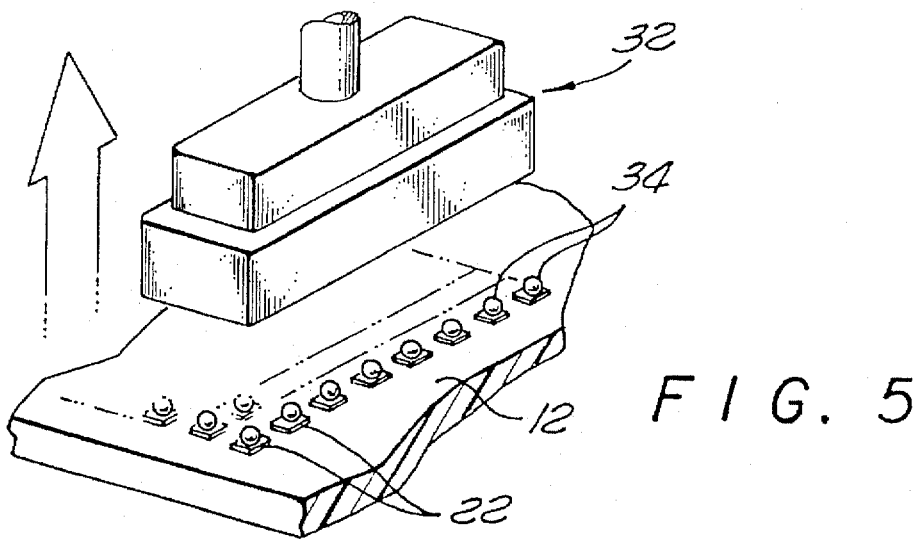
FIG. 5 is a perspective view showing the fixture removed from the printed circuit board.

As shown in FIG. 4, the fixture 32 is placed onto the printed circuit board 12 so that the fixture holes 36 are aligned with the surface pads 22 of the board. The vacuum is released, wherein the solder balls 34 fall onto the surface pads 22. As shown in FIG. 5, the fixture 32 is removed, thereby leaving the solder balls 34 attached to the surface pads 22 of the board 12. The fixture 32 can again be inspected to insure that all of the solder balls 34 were released from the holes 36. The process of capturing and releasing solder balls 34 can be repeated until all of the desired conductive surface pads 22 have a ball 34 attached thereto. Integrated circuit packages 10 are then placed onto the solder balls 34 and the solder is reflowed to attach the packages 10 to the board 12, as shown in FIG. 6. To maintain the position of the package 10 relative to the solder balls 34 and board 12, a solder flux may be applied to the bottom of the package 10 before being placed onto the balls 34. The solder is typically reflowed by placing the board 12 and packages 10 into a reflow oven. The solder flux 28 acts as a bonding agent which prevents movement of the solder balls 34 until the package 10 is soldered to the board 12.

FIGS. 7–9 show another method for soldering packages 10 to a printed circuit board. A fixture 40 is placed onto the bottom surface 18 of the package 10 so that a plurality of fixture holes 42 are aligned with the conductive surface pads 16 of the package 10.

As shown in FIG. 8, a plurality of solder balls 34 are inserted into the holes 42 of the fixture 40, wherein the balls 34 fall onto the surface pads 16 of the package 10. The fixture holes 42 may have a taper that leads the balls 34 onto the surface pads 16. Additionally, the depth of the fixture holes 42 may be such to prevent the insertion of more than one solder ball 34 in a single hole 42.

As shown in FIG. 9, the solder balls 34 are reflowed and the fixture 40 is removed, wherein the balls 34 are attached to the surface pads 16 of the package 10. The solder is typically reflowed by placing the package 10, fixture 40 and solder balls 34 into a reflow oven. The fixture holes 42 should be large enough to compensate for any change in shape of the solder balls 34 during the reflow process. Additionally, the fixture 40 should be constructed from a material that does not adhere to solder and which has a coefficient of thermal expansion that is approximately equal to the package 10 coefficient of thermal expansion of the package 10. The fixture 40 may be constructed from Kevlar™ or TEFLON™. The fixture 40 prevents movement of the solder balls 34 during the reflow process. Additionally, the solder balls 34 can be covered with a solder flux before insertion into the fixture 40 to create an adhesion between the balls 34 and the package during the reflow process. The integrated circuit package 10 and solder balls 34 can be mounted to a circuit board 12, wherein the solder can again be reflowed to attach the package 10 to the board 12. Although the process described and shown in FIGS. 7–9 show the attachment of the solder balls 34 to an integrated circuit package 10, it is to be understood that the method can also be used to attach the balls 34 to conductive surface pads 22 of the printed circuit board 12.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A method for attaching a solder ball to a conductive pad of an integrated circuit package, comprising the steps of:

a) placing a fixture on the integrated circuit package such that a tapered opening within the fixture is aligned with the conductive pad;

b) placing a solder ball into the fixture opening so that said tapered opening aligns said solder ball so that the solder ball is adjacent to the conductive pad;

c) reflowing the solder ball; and, d) removing the fixture from the integrated circuit package.

* * * * *